United States Patent
Yang et al.

(10) Patent No.: US 9,293,603 B2
(45) Date of Patent: Mar. 22, 2016

(54) THIN FILM TRANSISTOR WITH OXIDE SEMICONDUCTOR HAVING A PORTION WITH INCREASED REFLECTANCE

(71) Applicant: LG Display Co., Ltd., Seoul (KR)

(72) Inventors: Hee-Jung Yang, Gyeonggi-do (KR); Won-Joon Ho, Jeollabuk-do (KR); A-Ra Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/526,832

(22) Filed: Oct. 29, 2014

(65) Prior Publication Data
US 2015/0144942 A1 May 28, 2015

(30) Foreign Application Priority Data
Nov. 26, 2013 (KR) .................. 10-2013-0144359

(51) Int. Cl.
*H01L 29/786* (2006.01)
*H01L 27/12* (2006.01)

(52) U.S. Cl.
CPC ...... *H01L 29/78696* (2013.01); *H01L 27/1225* (2013.01); *H01L 29/7869* (2013.01); *H01L 29/78648* (2013.01)

(58) Field of Classification Search
CPC .............. H01L 29/78696; H01L 29/7869; H01L 27/1225; H01L 29/78648
USPC ........................................................ 257/43
See application file for complete search history.

(56) References Cited

U.S. PATENT DOCUMENTS

| 7,741,775 | B2* | 6/2010 | Yamazaki et al. | 313/512 |
| 2011/0193081 | A1* | 8/2011 | Godo et al. | 257/43 |
| 2012/0292618 | A1* | 11/2012 | Nomura | C25B 1/003 257/43 |
| 2013/0056741 | A1* | 3/2013 | Harumoto | H01L 27/1214 257/59 |
| 2013/0217180 | A1* | 8/2013 | Facchetti et al. | 438/104 |
| 2013/0320328 | A1* | 12/2013 | Lee et al. | 257/43 |

OTHER PUBLICATIONS

Liu et al., "Ambient Stability Enhancement of Thin-Film Transistor With InGaZnO Capped With InGaZnO:N Bilayer Stack Channel Layers", IEEE Electron Device Letters, vol. 32, No. 10, pp. 1397-1399, Oct. 2011.

* cited by examiner

*Primary Examiner* — Peter Bradford
(74) *Attorney, Agent, or Firm* — Morgan, Lewis & Bockius LLP

(57) ABSTRACT

An oxide thin film transistor (TFT) includes an oxide semiconductor layer including a first semiconductor layer and a second semiconductor layer on the first semiconductor layer; a gate insulating layer on the oxide semiconductor layer; a gate electrode on the gate insulating layer; an interlayer insulating layer on the gate electrode; and a source electrode and a drain electrode on the interlayer insulating layer and contacting the oxide semiconductor layer, wherein a first reflectance of the first semiconductor layer is greater than a second semiconductor layer.

20 Claims, 10 Drawing Sheets

THIN FILM TRANSISTOR WITH OXIDE SEMICONDUCTOR HAVING A PORTION WITH INCREASED REFLECTANCE

The present application claims the benefit of Korean Patent Application No. 10-2013-0144359, filed in Korea on Nov. 26, 2013, which is hereby incorporated by reference.

BACKGROUND OF THE INVENTION

1. Field of the Invention

The present invention relates to a thin film transistor (TFT), and more particularly, to an oxide TFT having excellent properties and improved reliability and an array substrate including the oxide TFT.

2. Discussion of the Related Art

As the society has entered an information age, a field of display devices that represent all sorts of electrical signals as visual images has developed rapidly. Particularly, the liquid crystal display (LCD) device or the organic light emitting diode (OLED) display device as a flat panel display device having characteristics of light weight, thinness and low power consumption is developed to be used as a substitute for a display device of cathode-ray tube type.

Since the LCD device including a thin film transistor (TFT) as a switching element, referred to as an active matrix LCD (AM-LCD) device, has excellent characteristics of high resolution and displaying moving images, the AM-LCD device has been widely used.

On the other hand, since the OLED device has excellent characteristics of high brightness, a low power consumption and high contrast ratio, the OLED display device has been widely used. Moreover, the OELD display device has advantages of a high response rate, a low production cost and so on. The OLED does not require a backlight such that thin and light-weight device is provided.

Both the LCD device and the OLED display device require a thin film transistor (TFT) as a switching element for controlling on and off of each pixel region. In addition, the OELD device requires another TFT as a driving element for driving an emitting diode in each pixel region.

The TFT including a semiconductor layer of amorphous silicon has been widely used.

Recently, to meet requirements of large size and high resolution, the TFTs having faster signal process, more stable operation and durability is required. However, the TFT using amorphous silicon has a relatively low mobility, e.g., less than 1 $cm^2$/Vsec, there is a limitation for the large and high resolution OLED display device.

Accordingly, an oxide TFT including an active layer of an oxide semiconductor material, which has an excellent electrical property, e.g., mobility and off-current, is introduced.

FIG. 1 is a cross-sectional view of the related art oxide TFT.

As shown in FIG. 1, the oxide TFT includes a gate electrode 21, a gate insulating layer 30, an oxide semiconductor layer 40, an etch-stopper 50, a source electrode 62 and a drain electrode 64.

The gate electrode 21 is formed on a substrate (not shown). The gate insulating layer 30 covers the gate electrode 21.

The oxide semiconductor layer 40 is formed on the gate insulating layer 30 and corresponds to the gate electrode 21. The oxide semiconductor layer 40 is formed of an oxide semiconductor material.

The etch-stopper 50 is formed on the oxide semiconductor layer 40 and corresponds to a center of the oxide semiconductor layer 40. Since the oxide semiconductor layer is easily damaged by an etchant for etching a metal layer for the source and drain electrodes 62 and 64, the oxide semiconductor layer 40 is protected by the etch-stopper 50. Both ends of the oxide semiconductor layer 40 are exposed.

The source and drain electrodes 62 and 64 are respectively connected to both ends of the oxide semiconductor layer 40 and are spaced apart from each other.

The TFT includes the oxide semiconductor layer 40 such that the properties of the TFT are improved.

However, the oxide semiconductor layer 40 is easily damaged by light. When the oxide TFT is used for the LCD device, the oxide semiconductor layer 40 is exposed to the ambient light. When the oxide TFT is used for the OLED display device, the oxide semiconductor layer 40 is exposed to the ambient light and the light from the emitting diode. As a result, the properties of the oxide TFT are degraded.

SUMMARY OF THE INVENTION

Accordingly, the present invention is directed to an oxide TFT and an array substrate including the same that substantially obviate one or more of the problems due to limitations and disadvantages of the related art.

An object of the present invention is to provide an oxide TFT having excellent properties and improved reliability.

Another object of the present invention is to provide an array substrate including the oxide TFT.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, an oxide thin film transistor (TFT) includes an oxide semiconductor layer including a first semiconductor layer and a second semiconductor layer on the first semiconductor layer; a gate insulating layer on the oxide semiconductor layer; a gate electrode on the gate insulating layer; an interlayer insulating layer on the gate electrode; and a source electrode and a drain electrode on the interlayer insulating layer and contacting the oxide semiconductor layer, wherein a first reflectance of the first semiconductor layer is greater than a second semiconductor layer.

In another aspect, an oxide thin film transistor (TFT) includes a first gate electrode; a gate insulating layer on the first gate electrode; an oxide semiconductor layer including first to third oxide semiconductor layers; a source electrode contacting a first portion of the oxide semiconductor layer; a drain electrode contacting a second portion of the oxide semiconductor layer; a passivation layer on the source electrode and the drain electrode; and a second gate electrode on the passivation layer, wherein the third semiconductor layer is positioned between the first and second semiconductor layer and has a reflectance being smaller than the first and second semiconductor layers.

In another aspect, an array substrate for a display device includes an oxide semiconductor layer including first and second oxide semiconductor layers on a substrate; a gate insulating layer on the oxide semiconductor layer; a gate electrode on the gate insulating layer; an interlayer insulating layer on the gate electrode; a source electrode and a drain electrode on the interlayer insulating layer and contacting the oxide semiconductor layer; a passivation layer on the source electrode and the drain electrode and including a drain contact hole; and a pixel electrode on the passivation layer and contacts the drain electrode through the drain contact hole, wherein a first reflectance of the first semiconductor layer is greater than a second semiconductor layer.

In another aspect, an array substrate for a display device includes a first gate electrode on a substrate; a gate insulating layer on the first gate electrode; an oxide semiconductor layer including first to third oxide semiconductor layers; a source electrode contacting a first portion of the oxide semiconductor layer; a drain electrode contacting a second portion of the oxide semiconductor layer; a first passivation layer on the source electrode and the drain electrode; a second gate electrode on the first passivation layer; a second passivation layer on the gate electrode and including a drain electrode; a pixel electrode on the second passivation layer and contacting the drain electrode through the drain electrode, wherein the third semiconductor layer is positioned between the first and second semiconductor layer and has a reflectance being smaller than the first and second semiconductor layers.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Reference will now be made in detail to the preferred embodiments, examples of which are illustrated in the accompanying drawings.

Figure 1:
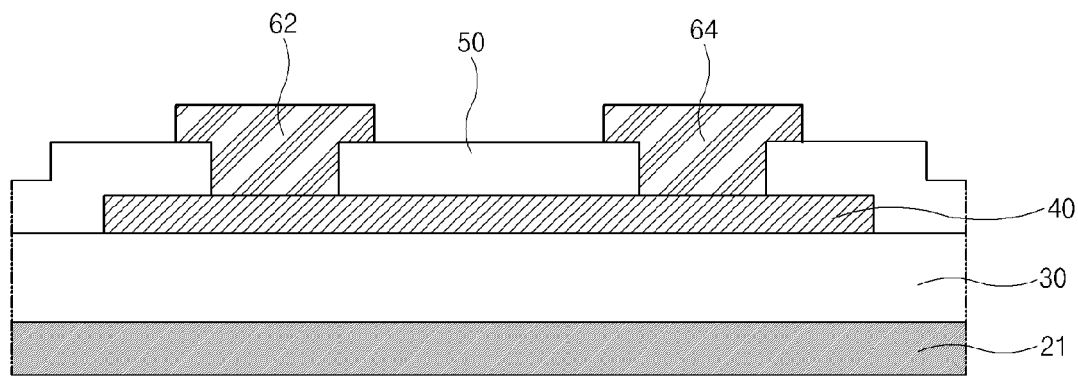
FIG. 1 is a cross-sectional view of the related art oxide TFT.
Figure 2:
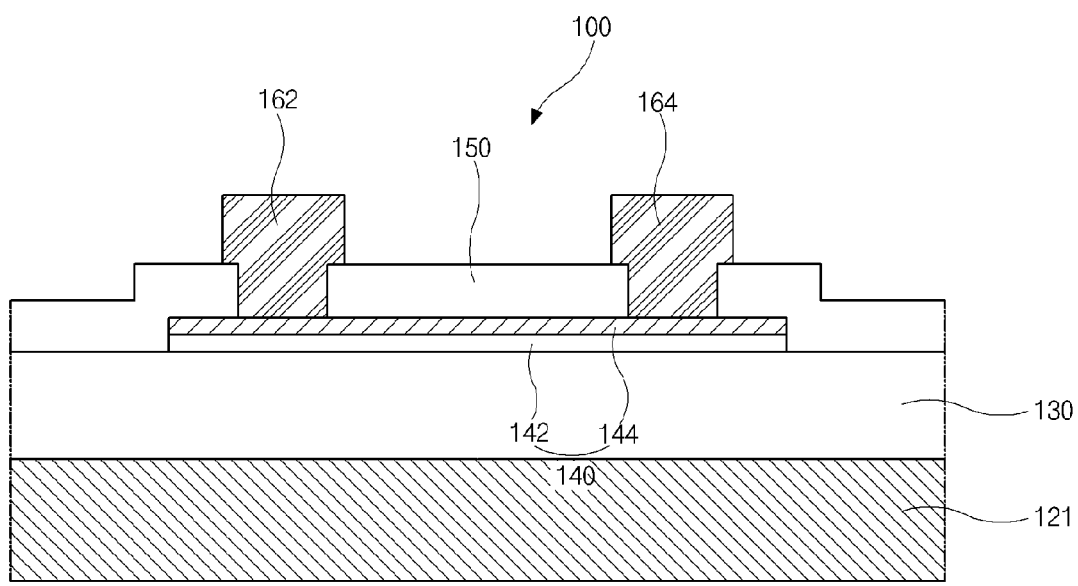
FIG. 2 is a cross-sectional view of an oxide TFT according to a first embodiment of the present invention.

FIG. 2 is a cross-sectional view of an oxide TFT according to a first embodiment of the present invention.

As shown in FIG. 2, the oxide TFT 100 includes a gate electrode 121, a gate insulating layer 130, an oxide semiconductor layer 140, an etch-stopper 150, a source electrode 162 and a drain electrode 164.

The gate electrode 121 is formed on a substrate (not shown) and is formed of a low resistance material, e.g., aluminum (Al), copper (Cu), gold (Au), silver (Ag), titanium (Ti), chromium (Cr), tungsten (W), tantalum (Ta), molybdenum (Mo) and their alloy of calcium (Ca), magnesium (Mg), zinc (Zn), Ti, Mo, nickel (Ni), manganese (Mn), zirconium (Zr), cadmium (Cd), Au, Ag, cobalt (Co), indium (In), Ta, hafnium (Hf), W and Cr. The gate insulating layer 130 covers the gate electrode 121. The gate insulating layer 130 is formed of an inorganic insulating material, e.g., silicon oxide or silicon nitride.

The oxide semiconductor layer 140 is formed on the gate insulating layer 130 and corresponds to the gate electrode 121. The oxide semiconductor layer 140 is formed of an oxide semiconductor material, e.g., indium-gallium-zinc-oxide (IGZO), indium-tin-zinc-oxide (ITZO), indium-zinc-oxide (IZO), indium-gallium-oxide (IGO) or indium-aluminum-zinc-oxide (IAZO).

The oxide semiconductor layer 140 includes a first semiconductor layer 142 and a second semiconductor layer 144. Nitrogen (N2) or sulfur (S) is doped into the oxide semiconductor material to form the second semiconductor layer 144. As a result, the second semiconductor layer 144 has a first reflectance being greater than a second reflectance of the first semiconductor layer 142.

The etch-stopper 150 is formed on the oxide semiconductor layer 140 and corresponds to a center of the oxide semiconductor layer 140. Since the oxide semiconductor layer is easily damaged by an etchant for etching a metal layer for the source and drain electrodes 162 and 164, the oxide semiconductor layer 140 is protected by the etch-stopper 150. Both ends of the oxide semiconductor layer 140 are exposed. For example, the etch-stopper 150 may be formed of an inorganic insulating material, e.g., silicon oxide or silicon nitride.

The source and drain electrodes 162 and 164 are respectively connected to both ends of the oxide semiconductor layer 140 and are spaced apart from each other. Each of the source and drain electrodes 162 and 164 is formed of a low resistance material, e.g., aluminum (Al), copper (Cu), gold (Au), silver (Ag), titanium (Ti), chromium (Cr), tungsten (W), tantalum (Ta), molybdenum (Mo) and their alloy of calcium (Ca), magnesium (Mg), zinc (Zn), Ti, Mo, nickel (Ni), manganese (Mn), zirconium (Zr), cadmium (Cd), Au, Ag, cobalt (Co), indium (In), Ta, hafnium (Hf), W and Cr.

The TFT includes the oxide semiconductor layer 140 such that the properties of the TFT are improved. A channel is generated in the first semiconductor layer 144, which is formed of an intrinsic oxide semiconductor material, such that the electrical properties of the oxide TFT 100 are improved. In addition, since the second semiconductor layer 144 of the oxide semiconductor layer 140 has a relatively high reflectance, the light irradiated to the oxide semiconductor layer 140 is blocked. As a result, the damage on the oxide semiconductor layer 140 is prevented without additional light-shielding or light-blocking layer.

However, when the N2 or S doped layer is positioned at the second semiconductor layer 144 as an upper layer, which contacts the source and drain electrodes 162 and 164, the contact property between each of the source and drain electrodes 162 and 164 and the oxide semiconductor layer 140 is degraded.

Figure 3:
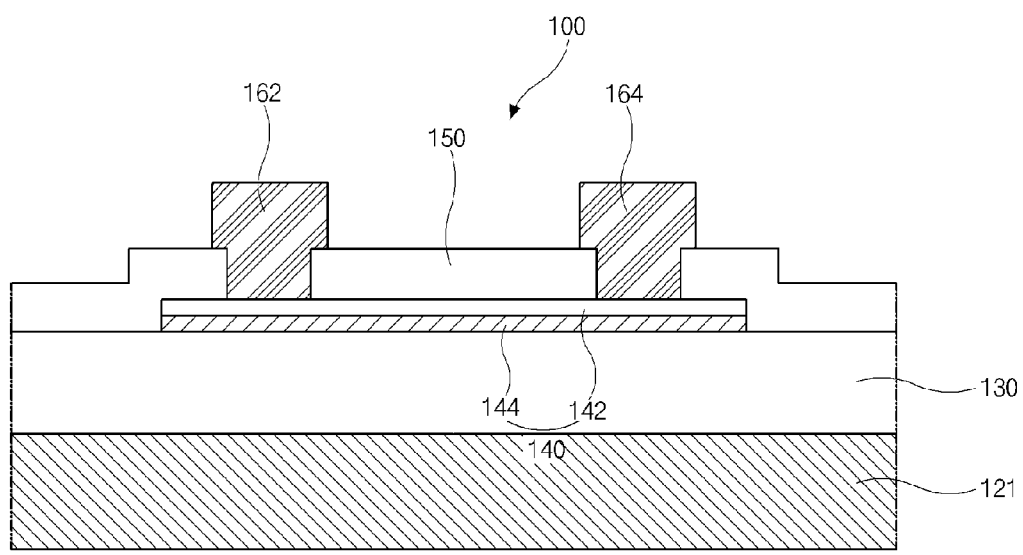
FIG. 3 is a cross-sectional view of an oxide TFT according to a second embodiment of the present invention.

FIG. 3 is a cross-sectional view of an oxide TFT according to a second embodiment of the present invention.

As shown in FIG. 3, the oxide TFT 100 includes a gate electrode 121, a gate insulating layer 130, an oxide semiconductor layer 140, an etch-stopper 150, a source electrode 162 and a drain electrode 164.

The gate electrode 121 is formed on a substrate (not shown) and is formed of a low resistance material, e.g., aluminum (Al), copper (Cu), gold (Au), silver (Ag), titanium (Ti), chromium (Cr), tungsten (W), tantalum (Ta), molybdenum (Mo) and their alloy of calcium (Ca), magnesium (Mg), zinc (Zn), Ti, Mo, nickel (Ni), manganese (Mn), zirconium (Zr), cadmium (Cd), Au, Ag, cobalt (Co), indium (In), Ta, hafnium (Hf), W and Cr. The gate insulating layer 130 covers the gate electrode 121. The gate insulating layer 130 is formed of an inorganic insulating material, e.g., silicon oxide or silicon nitride.

The oxide semiconductor layer 140 is formed on the gate insulating layer 130 and corresponds to the gate electrode 121. The oxide semiconductor layer 140 is formed of an oxide semiconductor material, e.g., indium-gallium-zinc-oxide (IGZO), indium-tin-zinc-oxide (ITZO), indium-zinc-oxide (IZO), indium-gallium-oxide (IGO) or indium-aluminum-zinc-oxide (IAZO).

The oxide semiconductor layer 140 includes a first semiconductor layer 142 and a second semiconductor layer 144. N2 or S is doped into the oxide semiconductor material to form the first semiconductor layer 142. As a result, the first semiconductor layer 142 has a first reflectance being greater than a second reflectance of the second semiconductor layer 144.

The etch-stopper 150 is formed on the oxide semiconductor layer 140 and corresponds to a center of the oxide semiconductor layer 140. Since the oxide semiconductor layer is easily damaged by an etchant for etching a metal layer for the source and drain electrodes 162 and 164, the oxide semiconductor layer 140 is protected by the etch-stopper 150. Both ends of the oxide semiconductor layer 140 are exposed. For example, the etch-stopper 150 may be formed of an inorganic insulating material, e.g., silicon oxide or silicon nitride.

The source and drain electrodes 162 and 164 are respectively connected to both ends of the oxide semiconductor layer 140 and are spaced apart from each other. Each of the source and drain electrodes 162 and 164 is formed of a low resistance material, e.g., aluminum (Al), copper (Cu), gold (Au), silver (Ag), titanium (Ti), chromium (Cr), tungsten (W), tantalum (Ta), molybdenum (Mo) and their alloy of calcium (Ca), magnesium (Mg), zinc (Zn), Ti, Mo, nickel (Ni), manganese (Mn), zirconium (Zr), cadmium (Cd), Au, Ag, cobalt (Co), indium (In), Ta, hafnium (Hf), W and Cr.

The TFT includes the oxide semiconductor layer 140 such that the properties of the TFT are improved. Since the N2 or S doped layer is positioned at the first semiconductor layer 142, a contact property between each of the source and drain electrodes 162 and 164 and the oxide semiconductor layer 140 is not degraded. However, a channel is generated in the first semiconductor layer 142, which is formed of an N2 or S-doped oxide semiconductor material, such that the electrical properties of the oxide TFT 100 are degraded.

Figure 4:
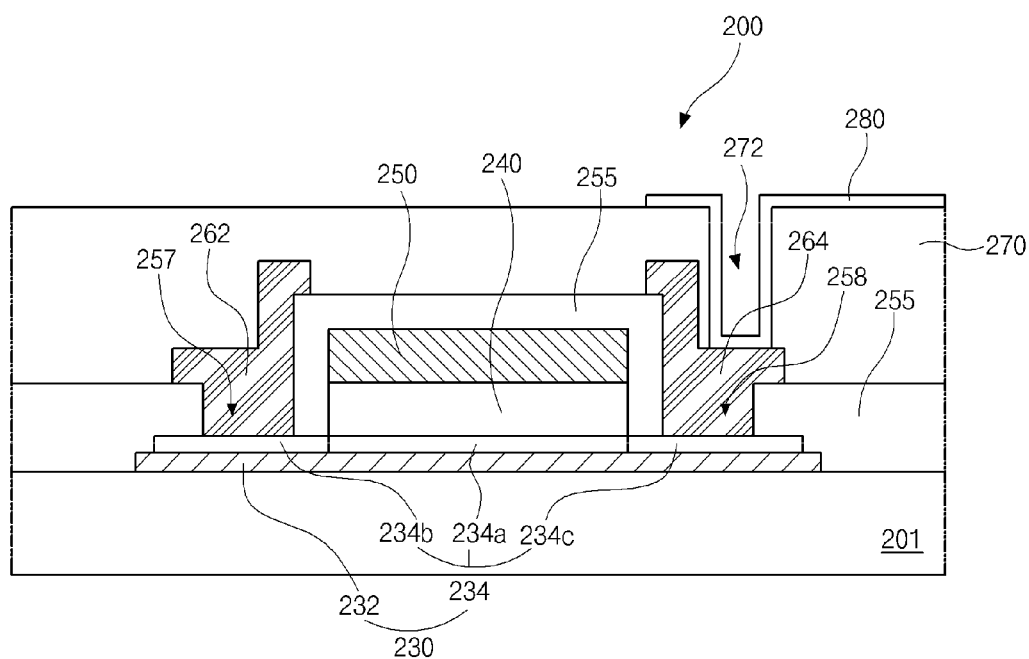
FIG. 4 is a cross-sectional view of an oxide TFT according to a third embodiment of the present invention.

FIG. 4 is a cross-sectional view of an oxide TFT according to a third embodiment of the present invention.

As shown in FIG. 4, the oxide TFT 200 includes an oxide semiconductor layer 230, a gate insulating layer 240, a gate electrode 250, an interlayer insulating layer 255, a source electrode 262 and a drain electrode 264.

The oxide semiconductor layer 230 is disposed on a substrate 201 and includes an oxide semiconductor material. The oxide semiconductor layer 230 includes a first semiconductor layer 232 and a second semiconductor layer 234 on the first semiconductor layer 232. The second semiconductor layer 234 includes a first region 234a at a center and second and third regions 234b and 234c at both sides of the first region 234a.

Alternatively, a buffer layer (not shown) may be disposed on the substrate 201, and the oxide semiconductor layer 230 may be disposed on the buffer layer. The buffer layer may be formed of an inorganic insulating material, e.g., silicon oxide or silicon nitride. When the oxide semiconductor layer 230 is disposed directly on the substrate 201 of glass, alkali ion may be diffused from the substrate 201 into the oxide semiconductor layer 230 such that the properties of the oxide TFT 200 may be degraded. Accordingly, by forming the buffer layer between the substrate 201 and the oxide semiconductor layer 230, the diffusion of alkali ion from the substrate 201 of glass into the oxide semiconductor layer 230 is prevented. The buffer layer can be omitted.

On the other hand, the substrate 201 may be a flexible plastic substrate. In this instance, the substrate 201 may include polyethersulphone (PES), polyacrylate (PAR), polyetherimide (PEI), polyethyelenennapthalate (PEB), polyethyeleneterepthalate (PET), polyphenylene sulfide (PPS), polyallylate, polyimide, polycarbonate (PC), cellulose triacetate (TAC) or cellulose acetate propinonate (CAP).

The gate insulating layer 240 is disposed on the oxide semiconductor layer 230 and is formed of an inorganic insulating material, e.g., silicon oxide or silicon nitride. The gate electrode 250 is disposed on the gate insulating layer 240 and is formed of a low resistance material, e.g., aluminum (Al), copper (Cu), gold (Au), silver (Ag), titanium (Ti), chromium (Cr), tungsten (W), tantalum (Ta), molybdenum (Mo) and their alloy of calcium (Ca), magnesium (Mg), zinc (Zn), Ti, Mo, nickel (Ni), manganese (Mn), zirconium (Zr), cadmium (Cd), Au, Ag, cobalt (Co), indium (In), Ta, hafnium (Hf), W and Cr. The gate electrode 250 corresponds to the oxide semiconductor layer 230.

Although not shown, a gate line, which extends along a first direction and is connected to the gate electrode 250, may be formed on the gate insulating layer 240.

The interlayer insulating layer 255 is disposed on the gate electrode 250 and the substrate 201. The interlayer insulating layer 255 includes first and second semiconductor contact holes 257 and 258 respectively exposing the second and third regions 234b and 234c of the oxide semiconductor layer 230.

FIG. 4 shows the gate insulating layer 240 has an island shape being substantially the same as the gate electrode 250. Alternatively, the gate insulting layer 240 may be disposed on an entire surface of the substrate 201. In this instance, the first and second semiconductor contact holes 257 and 258 may be formed through the interlayer insulating layer 255 and the gate insulating layer 240.

The source electrode 262 and the drain electrode 264 are disposed on the interlayer insulating layer 255 and contact the second and third regions 234b and 234c of the oxide semiconductor layer 230 through the first and second semiconductor contact holes 257 and 258, respectively. The source and drain electrodes 262 and 264 are spaced apart from each other. The source and drain electrodes 262 and 264 are formed of a low resistance material, e.g., aluminum (Al), copper (Cu), gold (Au), silver (Ag), titanium (Ti), chromium (Cr), tungsten (W), tantalum (Ta), molybdenum (Mo) and their alloy of calcium (Ca), magnesium (Mg), zinc (Zn), Ti, Mo, nickel (Ni), manganese (Mn), zirconium (Zr), cadmium (Cd), Au, Ag, cobalt (Co), indium (In), Ta, hafnium (Hf), W and Cr.

Although not shown, a data line, which extends along a second direction and is connected to the source electrode 262, is disposed on the interlayer insulating layer 255. The data line crosses the gate line to define a pixel region.

In addition, a passivation layer 270 is disposed on the oxide TFT 200. The passivation layer 270 includes a drain contact hole 272 exposing the drain electrode 264. A pixel electrode 280, which contacts the drain electrode 264 through the drain contact hole 272, is disposed on the passivation layer 270 in each pixel region.

The oxide TFT 200 and the pixel electrode 280 constitute an array substrate for a display device, for example, an LCD device or an OLED display device. When the array substrate is used for the OLED display device, another TFT is further formed.

The oxide TFT 200 shown in FIG. 4 may be referred to as a coplanar structure. In this instance, a lower surface of the oxide semiconductor layer 230 may be exposed to a backlight unit or ambient light. To prevent damage on the oxide semiconductor layer 230 by the light, a light-shielding layer under the oxide semiconductor layer 230 is required.

However, in the present invention, the damage on the oxide semiconductor layer 230 by the light is prevented without additional light shielding layer.

In the oxide semiconductor layer 230 of the present invention, the first semiconductor layer 232 has a first reflectance greater than a second reflectance of the second semiconductor layer 234. The first semiconductor layer 232 serves as a light-shielding layer and as a buffer layer preventing the alkali ion diffusion from the substrate 201. Accordingly, additional buffer layer on the substrate 201 is not required.

The first and second semiconductor layer 232 and 234 includes or are formed of an oxide semiconductor layer, e.g., indium-gallium-zinc-oxide (IGZO), indium-tin-zinc-oxide (ITZO), indium-zinc-oxide (IZO), indium-gallium-oxide (IGO) or indium-aluminum-zinc-oxide (IAZO). In addition, the first semiconductor layer 232 further includes sulfur (S) with or without at least one of boron (B), carbon (C), fluorine (F), helium (He), silicon (Si), phosphorous (P), germanium (Ge), arsenic (As), tellurium (Te) and selenium (Se).

The first semiconductor layer 232 may be deposited using a target including the oxide semiconductor material with sulfur. Alternatively, the first semiconductor layer 232 may be forming by depositing the oxide semiconductor material and doping sulfur. The first semiconductor layer 232 may be semi-transparent.

Alternatively, the first semiconductor layer 232 may be formed of a metal nitride compound, e.g., copper nitride (CuNx) or zinc nitride (ZnN), or a metal oxide, e.g., $Cu_2O$. Namely, the first semiconductor layer 232 may be formed of a different material from the second semiconductor layer 234.

Since a channel is generated in the second semiconductor layer 234, which is formed an intrinsic oxide semiconductor material, the electrical properties of the oxide TFT 200 are improved. In addition, since the light is blocked by the first semiconductor layer 232, the damage on the channel is prevented. Moreover, when sulfur is doped into the first semiconductor layer 232, sulfide ions are formed in the second semiconductor layer 234 such that the stability of the oxide TFT 200 is further secured. Alternatively, N2 may be deposited with our without sulfur. Furthermore, since the source and drain electrodes 262 and 264 contact the second semiconductor layer 234, there is no contact problem.

FIGS. 5A to 5E are cross-sectional views showing a fabricating process of a display region of an array substrate according to the third embodiment of the present invention.

Figure 5A:
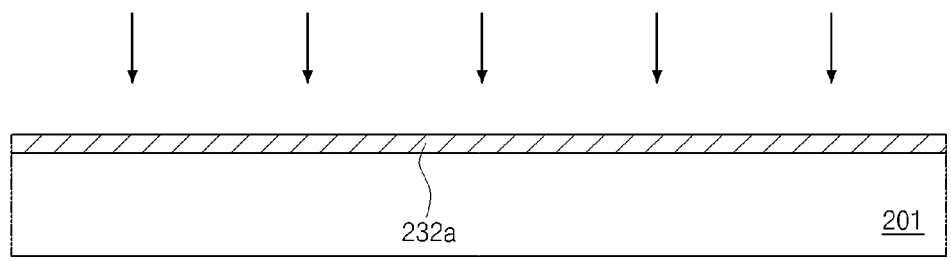
FIGS. 5A to 5E are cross-sectional views showing a fabricating process of a display region of an array substrate according to the third embodiment of the present invention.

As shown in FIG. 5A, an oxide semiconductor material, e.g., indium-gallium-zinc-oxide (IGZO), indium-tin-zinc-oxide (ITZO), indium-zinc-oxide (IZO), indium-gallium-oxide (IGO) or indium-aluminum-zinc-oxide (IAZO), is deposited and sulfur is doped to form an doped oxide semiconductor layer 232a on the substrate 201. The doping of sulfur may be performed by $SF_6$ plasma process. In addition, at least one of boron (B), carbon (C), fluorine (F), helium (He), silicon (Si), phosphorous (P), germanium (Ge), arsenic (As), tellurium (Te) and selenium (Se) may be doped with sulfur.

Alternatively, a target including the oxide semiconductor material and sulfur with or without at least one of boron (B), carbon (C), fluorine (F), helium (He), silicon (Si), phosphorous (P), germanium (Ge), arsenic (As), tellurium (Te) and selenium (Se) is loaded in a sputtering chamber and a deposition process is performed to form the doped semiconductor layer 232a. In this instance, the deposition process may be performed under a condition of $SF_6$ gas. The $SF_6$ gas is colorless, odorless nontoxic gas in a room temperature and has a thermal stability in a temperature of about 500° C.

Next, an intrinsic oxide semiconductor layer (not shown) is formed on the doped oxide semiconductor layer 232a by using a sputtering target of the oxide semiconductor material.

Figure 5B:
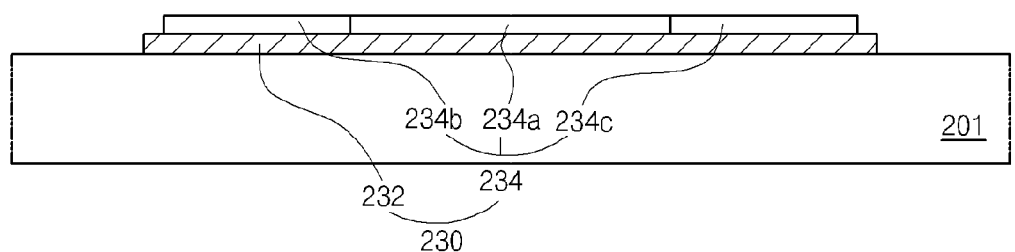

Next, as shown in FIG. 5B, the intrinsic oxide semiconductor layer and the doped oxide semiconductor layer 232a (of FIG. 3A) are patterned by a mask process to form the first semiconductor layer 232 and the second semiconductor layer 234 of the oxide semiconductor layer 230.

Since the first semiconductor layer 232 is a doped layer by sulfur, a first etching rate of the first semiconductor layer 232 is lower or slower than a second etching rate of the second semiconductor layer 234. Namely, when the intrinsic oxide semiconductor layer and the doped oxide semiconductor layer 232a (of FIG. 5A) are etched using an etchant being capable of etching the oxide semiconductor material, e.g., IGZO, the first semiconductor layer 232 has a first width larger than the second semiconductor layer 234. For example, the etchant may include hydrogen peroxide ($H_2O_2$). Accordingly, the light to the second semiconductor layer 234 from a direction of the substrate 201 is completely blocked by the first semiconductor layer 232.

Alternatively, when the first semiconductor layer 232 does not includes sulfur, an etching rate of the first semiconductor layer 232 is higher or greater than an etching rate of the second semiconductor layer 234. In this instance, when the first and second semiconductor layers 232 and 234 are etched by a single mask process, the first semiconductor layer 232 has a width smaller than the second semiconductor layer 234 such that the second semiconductor layer 234 may be exposed to the light. To prevent this problem, the first and second semiconductor layers 232 and 234 should be patterned by different mask processes.

However, when the first semiconductor layer 232 includes sulfur, the second semiconductor layer 234 is completely or perfectly shielded by the first semiconductor layer 232 even if the first and second semiconductor layers 232 and 234 are etched by a single mask process. As a result, the fabricating process is simplified and the production costs are reduced. Alternatively, the first semiconductor layer 232 may have the same width as the second semiconductor layer 234. Namely, the first semiconductor layer 232 has a width being equal to or larger than the second semiconductor layer 234.

Figure 5C:
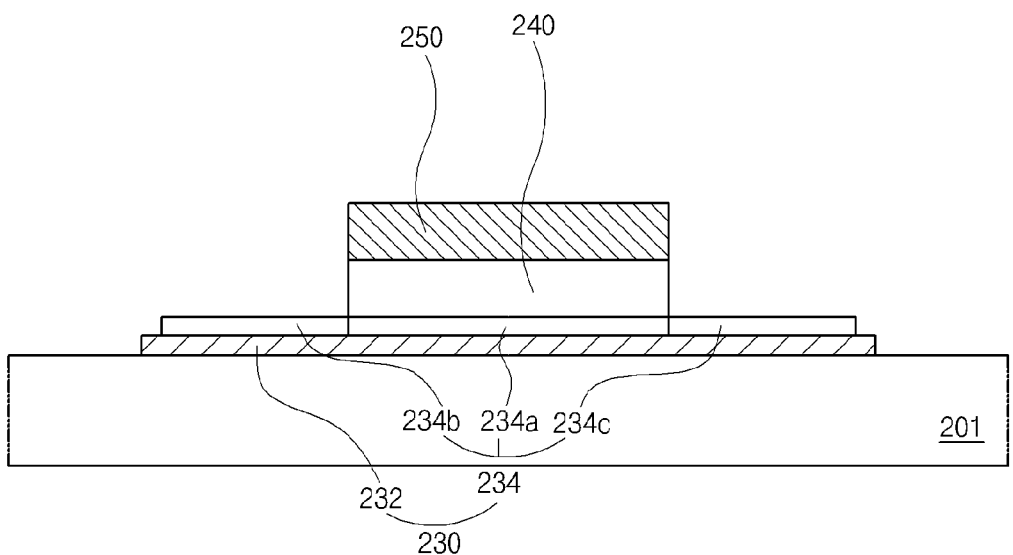

Next, as shown in FIG. 5C, a first insulating layer (not shown) is formed on the substrate 201 including the oxide semiconductor layer 230. The first insulating layer may be formed of silicon oxide or silicon nitride. A first metal layer (not shown) is formed on the first insulating layer. The first metal layer may be formed of at least one of aluminum (Al), copper (Cu), gold (Au), silver (Ag), titanium (Ti), chromium (Cr), tungsten (W), tantalum (Ta), molybdenum (Mo) and their alloy of calcium (Ca), magnesium (Mg), zinc (Zn), Ti, Mo, nickel (Ni), manganese (Mn), zirconium (Zr), cadmium (Cd), Au, Ag, cobalt (Co), indium (In), Ta, hafnium (Hf), W and Cr.

The first insulating layer and the first metal layer are etched by a mask process to form the gate insulating layer 240 and the gate electrode 250. The gate electrode 250 corresponds to the first region 234c of the second semiconductor layer 234.

Figure 5D:
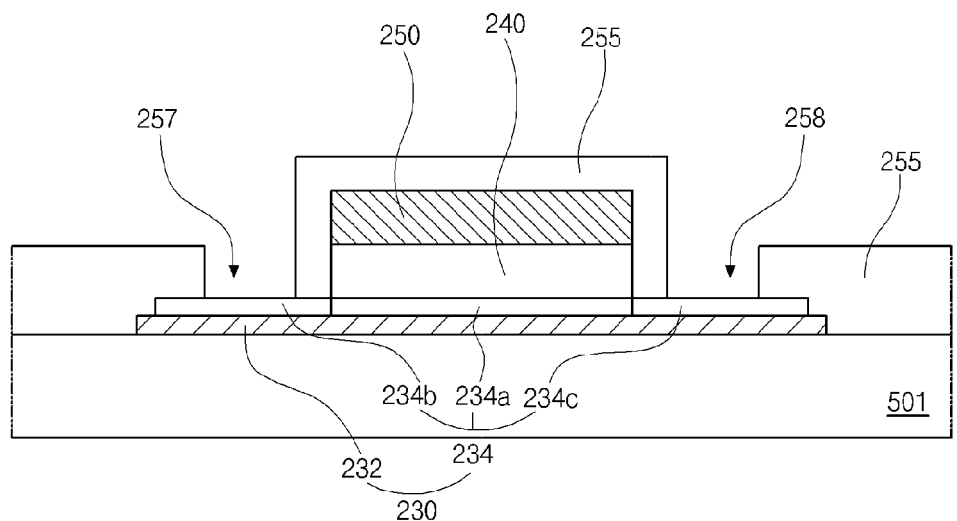

Next, as shown in FIG. 5D, a second insulating layer (not shown) is formed on the substrate 201 including the gate electrode 250. The second insulating layer is patterned to form the interlayer insulating layer 255 including the first and second semiconductor contact holes 257 and 258. The second and third regions 234b and 234c of the second semiconductor layer 234 are exposed through the first and second semiconductor contact holes 257 and 258, respectively.

Figure 5E:
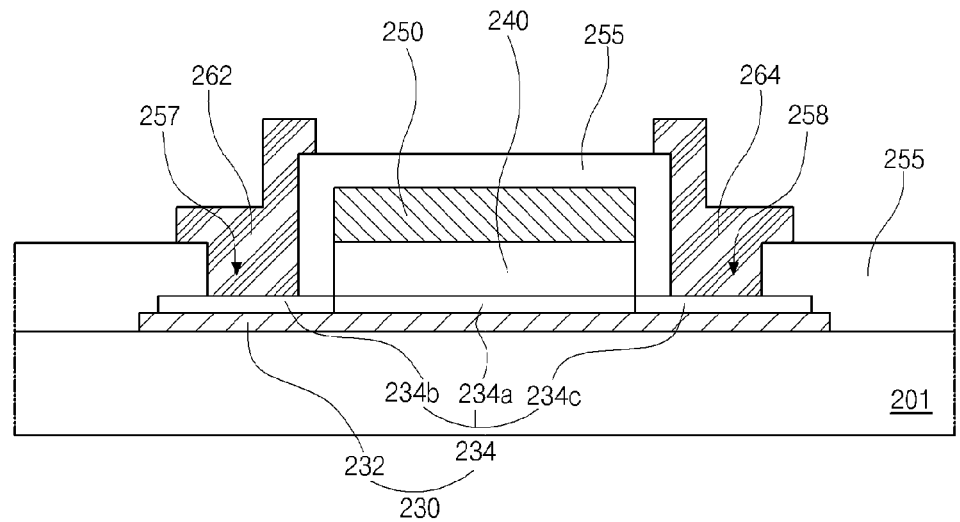

Next, as shown in FIG. 5E, a second metal layer (not shown) is formed on the substrate 201 including the interlayer insulating layer 255. The second metal layer is patterned by a mask process to form the source electrode 262 and the drain electrode 264 spaced apart from each other. The source and drain electrodes 262 and 264 contact the second and third regions 234b and 234c through the first and second semiconductor contact holes 257 and 258, respectively. The second metal layer may be formed of the same material as the first metal layer.

The oxide TFT 200 of the present invention is fabricated by the above processes.

Although not shown, the gate line, which is connected to the gate electrode 250, is also formed on the gate insulating layer 230, and the data line crossing the gate line and being connected to the source electrode is formed on the interlayer insulating layer 255.

In addition, a third insulating layer is formed on the substrate 201 including the source and drain electrodes 262 and 264 and is patterned to form the passivation layer 270 including the drain contact hole 272. A conductive material layer is formed and patterned to form a pixel electrode 280, which contacts the drain electrode 264 through the drain contact hole 272, on the passivation layer 270. As a result, an array substrate for a display device is fabricated.

Figure 6:
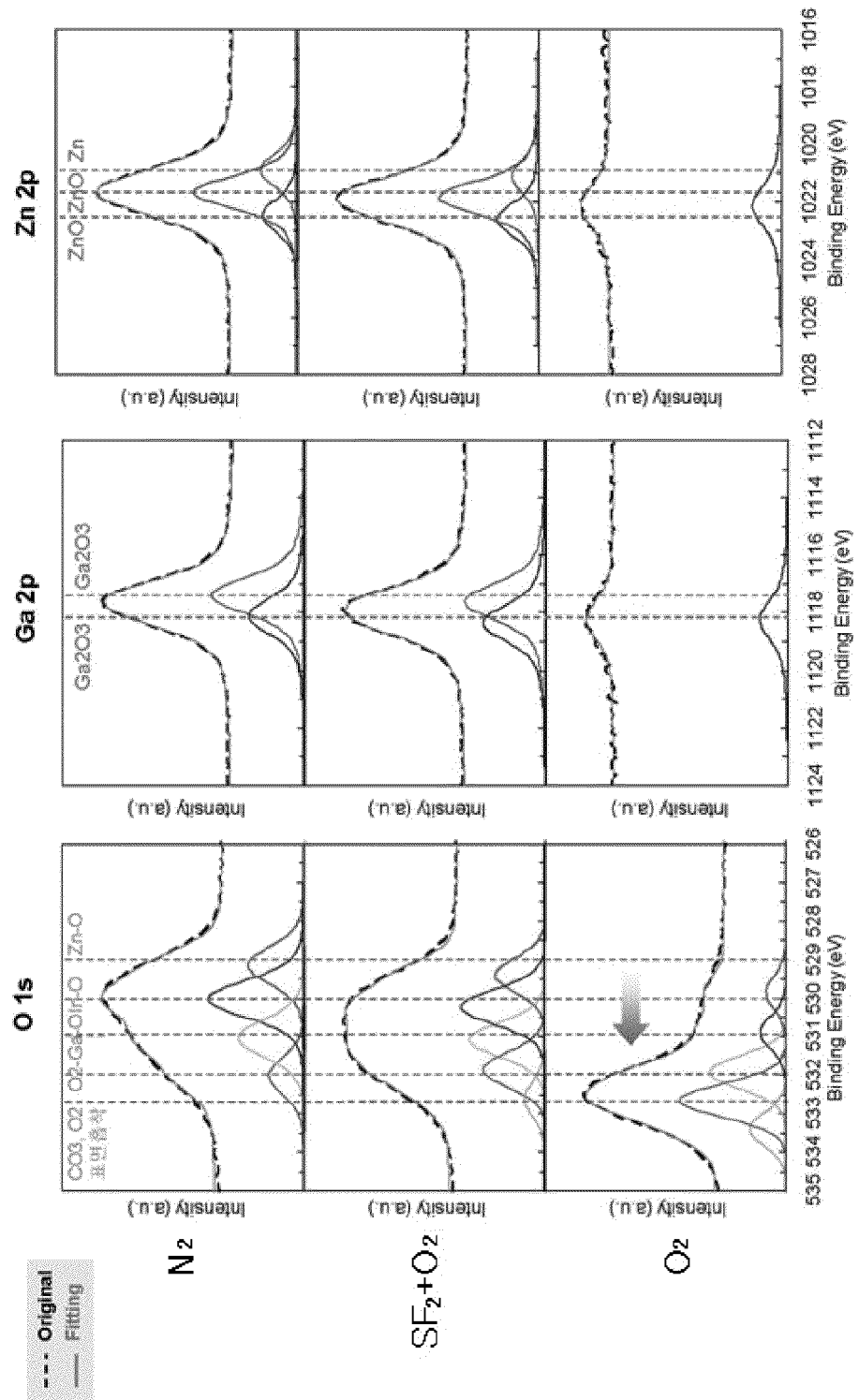
FIG. 6 is a graph illustrating a surface of an oxide semiconductor layer according to a plasma condition.

FIG. 6 is a graph illustrating a surface of an oxide semiconductor layer according to a plasma condition. The graph in FIG. 6 is obtained by depositing an oxide semiconductor material under a condition of $N_2$ plasma, $O_2$ plasma and $SF_6$ plasma ($SF_6+O_2$). The reactivity in a surface of the oxide semiconductor layer deposited under the above plasma conditions is explained with reference to FIG. 6.

When the oxide semiconductor layer is treated by the $N_2$ plasma, the graph is not positioned in a normal bonding energy range and is shifted in one side.

When the oxide semiconductor layer is treated by the $O_2$ plasma, $O_2$ absorption at the surface of the oxide semiconductor layer is generated such that the surface of the oxide semiconductor layer is not stable.

However, when the oxide semiconductor layer is treated by the $SF_6$ plasma, the graph is not shifted and the surface of the oxide semiconductor layer is stable. Namely, the oxide semiconductor layer has a relatively low reactivity.

Figure 7A:
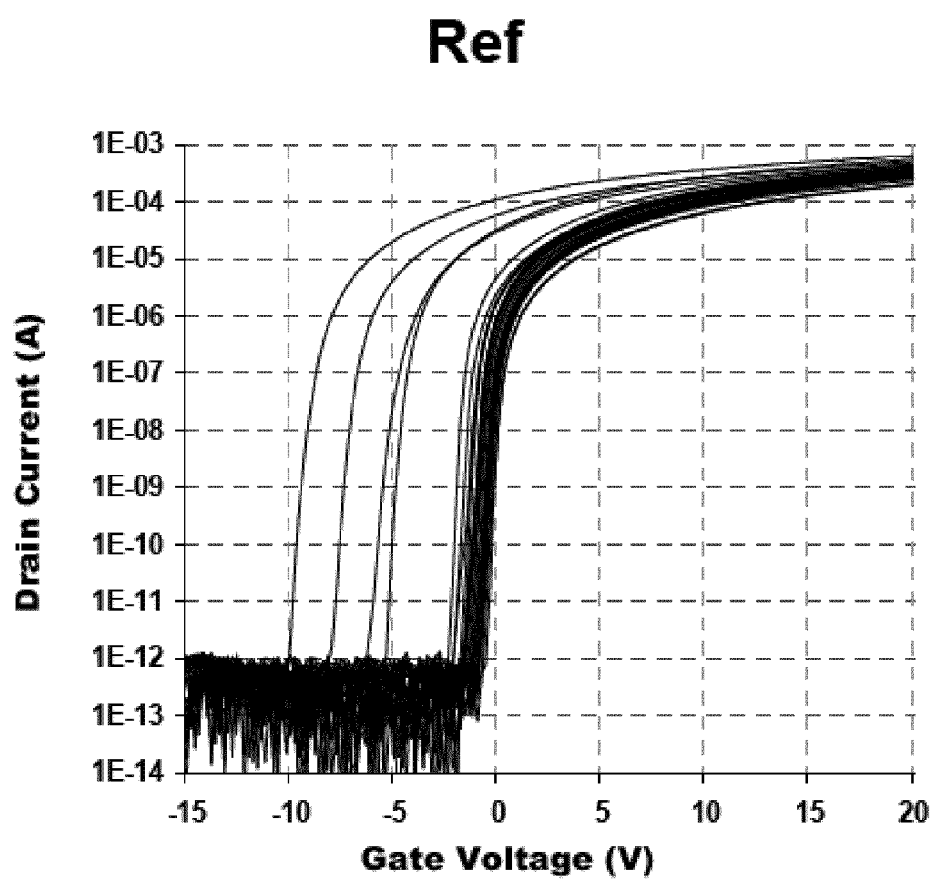
FIGS. 7A to 7C are graphs showing a drain current with respect to a gate voltage.
Figure 7B:
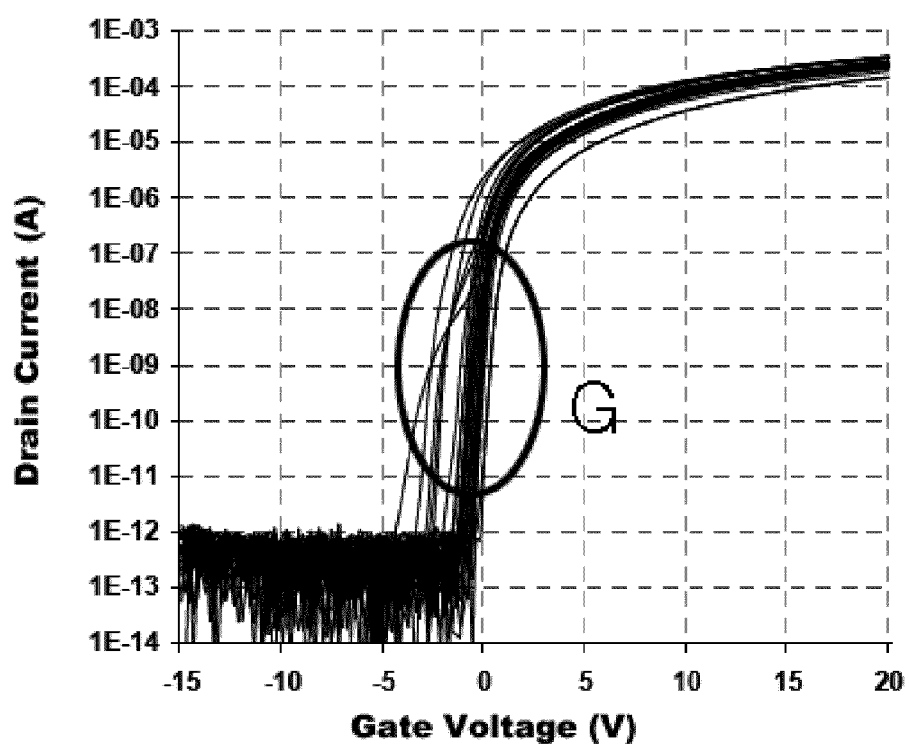
Figure 7C:
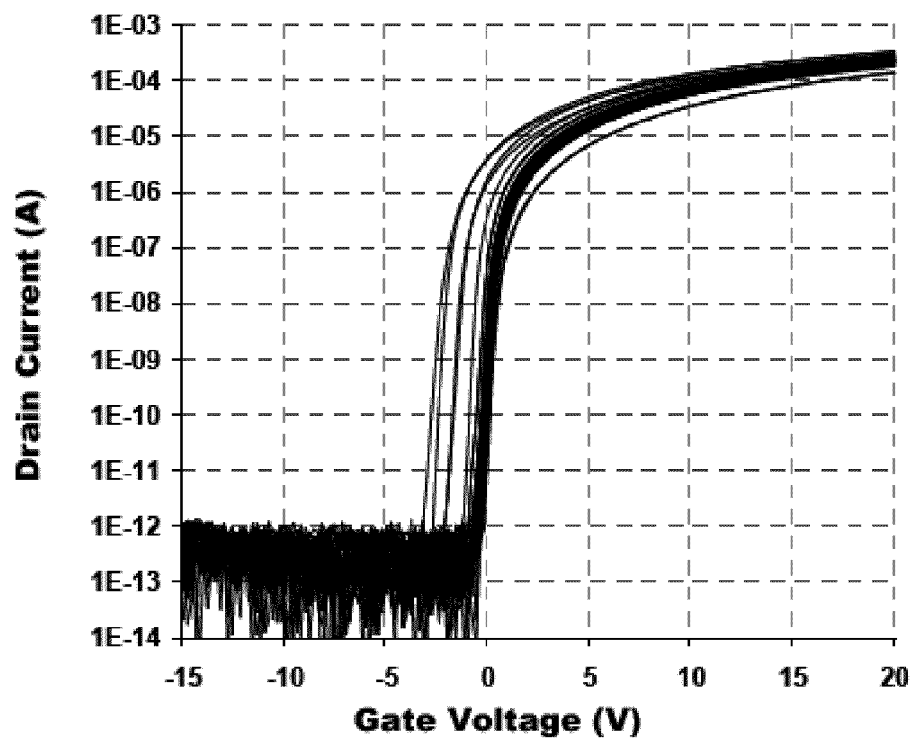

FIGS. 7A to 7C are graphs showing a drain current with respect to a gate voltage. FIG. 7A is a graph in the related art oxide TFT, and FIG. 7B is a graph in the oxide TFT having a structure in FIG. 4 where the first semiconductor layer is doped with $H_2$. FIG. 7C is a graph in the oxide TFT having a structure in FIG. 4 where the first semiconductor layer is doped with sulfur.

In FIG. 7A, a threshold voltage of the TFTs is not uniform and has a range between −10 to 0V. In FIG. 7B, the threshold voltage of the TFTs has a range between −4 to 0V. However, the TFT has a rapid property change in the "G" portion.

However, in FIG. 7C, the oxide TFTs in the present invention has a threshold voltage in a range between −3 to 0V and a uniform property.

Figure 8:
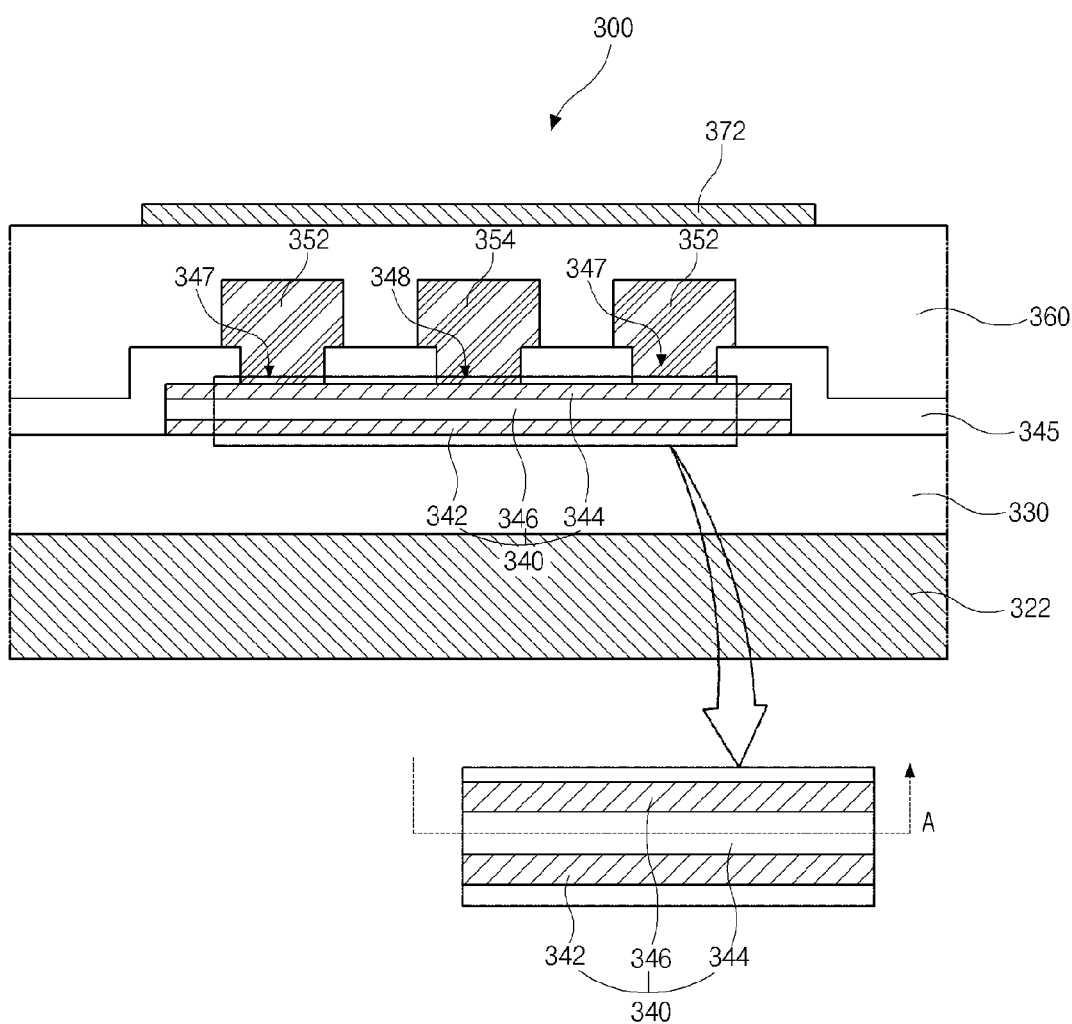
FIG. 8 is a cross-sectional view of an oxide TFT according to a fourth embodiment of the present invention.

FIG. 8 is a cross-sectional view of an oxide TFT according to a fourth embodiment of the present invention.

As shown in FIG. 8, the oxide TFT 300 includes a first gate electrode 322, a gate insulating layer 330, an oxide semiconductor layer 340, an etch-stopper 345, a source electrode 352, a drain electrode 354, a passivation layer 360 and a second gate electrode 372.

The gate electrode 322 is formed on a substrate (not shown) and is formed of a low resistance material, e.g., aluminum (Al), copper (Cu), gold (Au), silver (Ag), titanium (Ti), chromium (Cr), tungsten (W), tantalum (Ta), molybdenum (Mo) and their alloy of calcium (Ca), magnesium (Mg), zinc (Zn), Ti, Mo, nickel (Ni), manganese (Mn), zirconium (Zr), cadmium (Cd), Au, Ag, cobalt (Co), indium (In), Ta, hafnium (Hf), W and Cr, a transparent conductive material, indium-tin-oxide (ITO) or indium-zinc-oxide (IZO), or a semi-transparent conductive material.

The gate insulating layer 330 is disposed on the first gate electrode 322 and is formed of an inorganic insulating material, e.g., silicon oxide or silicon nitride.

The oxide semiconductor layer 340 is disposed on the gate insulating layer 330 and includes first to third semiconductor layers 342, 344 and 346 forming a triple-layered structure. Namely, the first semiconductor layer 342 is disposed on the gate insulating layer 330, and the third semiconductor layer 346 is positioned between the first and second semiconductor layers 342 and 344. Each of the first and second semiconductor layers 342 and 344 has a width being equal to or larger than the third semiconductor layer 346.

Each of the first to third semiconductor layers 342, 344 and 346 includes an oxide semiconductor material, e.g., indium-gallium-zinc-oxide (IGZO), indium-tin-zinc-oxide (ITZO), indium-zinc-oxide (IZO), indium-gallium-oxide (IGO) or indium-aluminum-zinc-oxide (IAZO). In addition, the first and second semiconductor layers 342 and 344 further includes sulfur with or without at least one of boron (B), carbon (C), fluorine (F), helium (He), silicon (Si), phosphorous (P), germanium (Ge), arsenic (As), tellurium (Te) and selenium (Se).

The first and second semiconductor layers 342 and 344 may be deposited using a target including the oxide semiconductor material with sulfur. Alternatively, the first and second semiconductor layers 342 and 344 may be forming by depositing the oxide semiconductor material and doping sulfur. Since the first to third semiconductor layers 342, 344 and 346 are formed in a single process chamber and by using the same target of the oxide semiconductor material, the fabricating process is simplified and the production costs are reduced. The first and second semiconductor layers 342 and 344 may be semi-transparent.

Alternatively, the first and second semiconductor layers 342 and 344 may be formed of a metal nitride compound, e.g., copper nitride (CuNx) or zinc nitride (ZnN), or a metal oxide, e.g., $Cu_2O$. Namely, the first and second semiconductor layers 342 and 344 may be formed of a different material from the third semiconductor layer 346.

In the oxide semiconductor layer 340 of the present invention, the first and second semiconductor layers 342 and 344 have a reflectance greater than a reflectance of the third semiconductor layer 346. Accordingly, the first and second semiconductor layers 342 and 344 serve as a light-shielding layer.

The third semiconductor layer 346, which is positioned between the first and second semiconductor layers 342 and 344 and is formed of an intrinsic oxide semiconductor material, serves as a channel.

The etch-stopper 345 is disposed on the second semiconductor layer 344 and includes first semiconductor contact holes 247 respectively exposing both ends of the second semiconductor layer 344 and a second semiconductor contact hole 248 exposing a center of the second semiconductor contact hole 344. The etch-stopper 345 may be formed of an inorganic insulating material, e.g., silicon oxide or silicon nitride.

The etch-stopper 345 protects the oxide semiconductor layer 340 such that the damage on the oxide semiconductor layer 340 by an etchant for the source and drain electrodes 352 and 354 is prevented.

The source and drain electrodes 352 and 354 are formed on the etch-stopper 345. The source electrode 352 contacts the oxide semiconductor layer 340 through the first semiconductor contact holes 347, and the drain electrode 354 contacts the oxide semiconductor layer 340 through the second semiconductor contact hole 348. FIG. 8 shows two source electrodes because the source electrode 352 has a "U" shape.

The passivation layer 360 is formed on the source and drain electrodes 352 and 354. The passivation layer 360 may be formed of an inorganic insulating material, e.g., silicon oxide or silicon nitride.

The second gate electrode 372 is disposed on the passivation layer 360 and corresponds to the oxide semiconductor layer 340. The second gate electrode 372 includes the same material as the first gate electrode 322. Alternatively, the second gate electrode 372 may include a different material from the first gate electrode 322. The second gate electrode 372 is connected to the first gate electrode 322.

In addition, another passivation layer (not shown) is disposed on the oxide TFT 300. The another passivation layer includes a drain contact hole exposing the drain electrode 354. A pixel electrode (not shown), which contacts the drain electrode 354 through the drain contact hole, is disposed on the another passivation layer in each pixel region.

In the present invention, since each of the first and second semiconductor layers 342 and 344 serves as a light-shielding layer, the damage on the oxide semiconductor layer 340, i.e., the third semiconductor layer 346, by the light is prevented even if the first and second semiconductor layers 322 and 372 are transparent. Accordingly, the limitation of the material for the first and second gate electrodes 322 and 372 is decreased.

In addition, the oxide TFT has a dual gate structure and a triple semiconductor structure, where a middle layer, i.e., the third semiconductor layer 346, includes an intrinsic oxide semiconductor material, the third semiconductor layer 346 serves as a channel. Namely, the channel is generated along the arrow "A".

When the triple semiconductor structure is used with a single gate structure, a channel is generated in the first semiconductor layer 342 or the second semiconductor layer 344. In this instance, the electrical properties of the oxide TFT 300 are degraded.

The array substrate including the oxide TFT of the present invention can be used for various LCD devices, e.g., a vertical alignment mode, an in-plane switching mode or a fringe field switching mode, or an OLED display device.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An oxide thin film transistor (TFT), comprising:
an oxide semiconductor layer including a first semiconductor layer and a second semiconductor layer stacked on the first semiconductor layer;
a gate insulating layer on the oxide semiconductor layer;
a gate electrode on the gate insulating layer;
an interlayer insulating layer on the gate electrode; and
a source electrode and a drain electrode on the interlayer insulating layer and contacting the oxide semiconductor layer,
wherein a reflectance of the first semiconductor layer is greater than the second semiconductor layer.

2. The TFT according to claim 1, wherein the first semiconductor layer includes a first oxide semiconductor layer doped with sulfur (S), and the second semiconductor layer includes a second oxide semiconductor layer.

3. The TFT according to claim 2, wherein the first semiconductor layer further includes at least one of boron (B), carbon (C), fluorine (F), helium (He), silicon (Si), phosphorous (P), germanium (Ge), arsenic (As), tellurium (Te) and selenium (Se).

4. The TFT according to claim 2, wherein each of the first and second semiconductor materials includes indium-gallium-zinc-oxide (IGZO), indium-tin-zinc-oxide (ITZO), indium-zinc-oxide (IZO), indium-gallium-oxide (IGO) or indium-aluminum-zinc-oxide (IAZO).

5. The TFT according to claim 1, wherein the first semiconductor layer has a width being equal to or larger than the second semiconductor layer.

6. An oxide thin film transistor (TFT), comprising:
a first gate electrode;
a gate insulating layer on the first gate electrode;
an oxide semiconductor layer including first to third oxide semiconductor layers stacked on each other;
a source electrode contacting a first portion of the oxide semiconductor layer;
a drain electrode contacting a second portion of the oxide semiconductor layer;
a passivation layer on the source electrode and the drain electrode; and
a second gate electrode on the passivation layer,
wherein the third semiconductor layer is positioned between the first and second semiconductor layer and has a reflectance being smaller than the first and second semiconductor layers.

7. The TFT according to claim 6, wherein each of the first and second semiconductor layer includes a first oxide semiconductor layer doped with sulfur (S), and the third semiconductor layer includes a second oxide semiconductor layer.

8. The TFT according to claim 7, wherein the first semiconductor layer further includes at least one of boron (B), carbon (C), fluorine (F), helium (He), silicon (Si), phosphorous (P), germanium (Ge), arsenic (As), tellurium (Te) and selenium (Se).

9. The TFT according to claim 7, wherein each of the first and second semiconductor materials includes indium-gallium-zinc-oxide (IGZO), indium-tin-zinc-oxide (ITZO), indium-zinc-oxide (IZO), indium-gallium-oxide (IGO) or indium-aluminum-zinc-oxide (IAZO).

10. The TFT according to claim 6, wherein each of the first and second semiconductor layers has a width being equal to or larger than the third semiconductor layer.

11. An array substrate for a display device, comprising:
an oxide semiconductor layer including first and second oxide semiconductor layers stacked on a substrate;
a gate insulating layer on the oxide semiconductor layer;
a gate electrode on the gate insulating layer;
an interlayer insulating layer on the gate electrode;
a source electrode and a drain electrode on the interlayer insulating layer and contacting the oxide semiconductor layer;
a passivation layer on the source electrode and the drain electrode and including a drain contact hole; and a pixel electrode on the passivation layer and contacts the drain electrode through the drain contact hole, wherein a reflectance of the first semiconductor layer is greater than the second semiconductor layer.

12. The array substrate according to claim 11, wherein the first semiconductor layer includes a first oxide semiconductor layer doped with sulfur (S), and the second semiconductor layer includes a second oxide semiconductor layer.

13. The array substrate according to claim 12, wherein the first semiconductor layer further includes at least one of boron (B), carbon (C), fluorine (F), helium (He), silicon (Si), phosphorous (P), germanium (Ge), arsenic (As), tellurium (Te) and selenium (Se).

14. The array substrate according to claim 12, wherein each of the first and second semiconductor materials includes indium-gallium-zinc-oxide (IGZO), indium-tin-zinc-oxide (ITZO), indium-zinc-oxide (IZO), indium-gallium-oxide (IGO) or indium-aluminum-zinc-oxide (IAZO).

15. The array substrate according to claim 11, wherein the first semiconductor layer has a width being equal to or larger than the second semiconductor layer.

16. An array substrate for a display device, comprising:
a first gate electrode on a substrate;
a gate insulating layer on the first gate electrode;
an oxide semiconductor layer including first to third oxide semiconductor layers stacked on each other;
a source electrode contacting a first portion of the oxide semiconductor layer;
a drain electrode contacting a second portion of the oxide semiconductor layer;
a passivation layer on the source electrode and the drain electrode;
a second gate electrode on the passivation layer; and
a pixel electrode contacting the drain electrode,
wherein the third semiconductor layer is positioned between the first and second semiconductor layer and has a reflectance being smaller than the first and second semiconductor layers.

17. The array substrate according to claim 16, wherein each of the first and second semiconductor layer includes a first oxide semiconductor layer doped with sulfur (S), and the third semiconductor layer includes a second oxide semiconductor layer.

18. The array substrate according to claim 17, wherein the first semiconductor layer further includes at least one of boron (B), carbon (C), fluorine (F), helium (He), silicon (Si), phosphorous (P), germanium (Ge), arsenic (As), tellurium (Te) and selenium (Se).

19. The array substrate according to claim 17, wherein each of the first and second semiconductor materials includes indium-gallium-zinc-oxide (IGZO), indium-tin-zinc-oxide (ITZO), indium-zinc-oxide (IZO), indium-gallium-oxide (IGO) or indium-aluminum-zinc-oxide (IAZO).

20. The array substrate according to claim 16, wherein each of the first and second semiconductor layers has a width being equal to or larger than the third semiconductor layer.

* * * * *